(12) United States Patent
Uda

(10) Patent No.: US 7,210,108 B2
(45) Date of Patent: Apr. 24, 2007

(54) STRUCTURE OF POWER SUPPLY PATH UTILIZED IN DESIGN OF INTEGRATED CIRCUIT

(75) Inventor: Kenichiro Uda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 299 days.

(21) Appl. No.: 10/658,195

(22) Filed: Sep. 10, 2003

(65) Prior Publication Data

US 2004/0057300 A1    Mar. 25, 2004

(30) Foreign Application Priority Data

Sep. 18, 2002   (JP) ............................. P2002-271362

(51) Int. Cl.
 *G06F 17/50*   (2006.01)
 *H01L 29/73*   (2006.01)
 *H01L 23/52*   (2006.01)

(52) U.S. Cl. ............................. 716/1; 716/2; 257/207; 257/691

(58) Field of Classification Search .................... 716/1, 716/2, 6, 7; 257/40, 759, 691, 159, 419, 257/207; 365/86
See application file for complete search history.

(56) References Cited

U.S. PATENT DOCUMENTS

| | | | | |
|---|---|---|---|---|
| 4,725,742 A * | 2/1988 | Tachimori et al. | ........... | 326/106 |
| 5,008,728 A * | 4/1991 | Yamamura et al. | .......... | 257/207 |
| 5,345,098 A * | 9/1994 | Hirabayashi et al. | ....... | 257/207 |
| 5,446,410 A | 8/1995 | Nakakura | | |
| 5,488,238 A * | 1/1996 | Enraku et al. | ............... | 257/207 |
| 5,854,534 A * | 12/1998 | Beilin et al. | ................. | 257/691 |
| 6,028,580 A * | 2/2000 | Kosegawa et al. | ............ | 345/98 |
| 6,102,710 A * | 8/2000 | Beilin et al. | ................... | 439/67 |
| 6,258,592 B1 * | 7/2001 | Ragsdale et al. | ......... | 435/285.2 |
| 6,303,948 B1 * | 10/2001 | Kudou et al. | ............... | 257/207 |
| 6,405,346 B1 * | 6/2002 | Nawa | ............................. | 716/2 |
| 6,608,612 B2 * | 8/2003 | Kokubun et al. | ............. | 345/98 |
| 6,617,622 B2 * | 9/2003 | Kudou et al. | ............... | 257/207 |
| 6,618,300 B2 * | 9/2003 | Yamakoshi | ................. | 365/200 |
| 6,711,724 B2 * | 3/2004 | Yoshikawa | ..................... | 716/6 |
| 6,963,136 B2 * | 11/2005 | Shinozaki et al. | ........... | 257/759 |
| 2003/0089908 A1* | 5/2003 | Mutoh et al. | ................. | 257/59 |

(Continued)

FOREIGN PATENT DOCUMENTS

JP     03-250735    11/1991

(Continued)

*Primary Examiner*—Jack Chiang
*Assistant Examiner*—Helen Rossoshek
(74) *Attorney, Agent, or Firm*—McDermott Will & Emery LLP

(57) ABSTRACT

According to a method of designing an integrated circuit, a plurality of outgoing lines branch off from each of main lines of respective power supply paths on the sides of VDD and VSS, and the pitches between adjacent outgoing lines of the plurality of outgoing lines are set so as to be equal to each other. Preferably, branching positions of the plural outgoing lines of one power supply path correspond to branching positions of the plural outgoing lines of another power supply path in the longitudinal direction of the power supply paths, or the lengths of the plural outgoing lines of one power supply path are set so as to be longer than the lengths of the plural outgoing lines of another power supply path.

13 Claims, 5 Drawing Sheets

U.S. PATENT DOCUMENTS

2004/0007778 A1* 1/2004 Shinozaki et al. .......... 257/759

FOREIGN PATENT DOCUMENTS

| JP | 07-078877 | 3/1995 |
| JP | 08-111506 A | 4/1996 |
| JP | 09-022945 A | 1/1997 |
| JP | 2912174 | 4/1999 |
| JP | 2003224462 A * | 8/2003 |

* cited by examiner

STRUCTURE OF POWER SUPPLY PATH UTILIZED IN DESIGN OF INTEGRATED CIRCUIT

BACKGROUND OF THE INVENTION

The present invention relates to a structure of a power supply path utilized in the design of an integrated circuit and more particularly, it relates to a technique of estimating charge and discharge times and power consumption of a part in which a power supply voltage is controlled. When a voltage supplied to a part of an integrated circuit or the whole thereof is controlled, it is necessary to estimate charge and discharge times of the part to be controlled. When performing this estimate, a resistance value and a stray capacitance value of a main line, and a resistance value and a stray capacitance value of an outgoing line are comprehensively considered in order to calculate the charge and discharge times.

The estimate of the charge and discharge times is made after cell arrangement is completed and the power supply path is determined. Even when configurations and dimensions of the outgoing lines of the power supply path are different from each other, since the estimate is made after the cell arrangement is completed, there is no problem. In other words, since the estimate is made after the cell arrangement is completed, correlation of the configurations and dimensions of the outgoing lines can be various.

However, in recent years, a high-performance and sophisticated system has been increasingly developed. Accordingly, referring to the estimate for the charge and discharge times and power consumption, it is necessary that the estimate be made at an early stage of the design process instead of being made after the cell arrangement is completed.

SUMMARY OF THE INVENTION

It is an object of the present invention to provide a structure of a power supply path utilized in the design of an integrated circuit in which an estimate for charge and discharge times and power consumption of a part to be controlled can be made at a stage before cell arrangement is completed.

In order to solve the above problems, according to a structure of a power supply path utilized in the design of an integrated circuit of the present invention, the pitches between adjacent outgoing lines of a plurality of outgoing lines branching off from a main line of a power supply path are set so as to be equal to each other in each of the power supply paths both on the power supply side of a high potential and the power supply side of a low potential.

Thus, resistance values and stray capacitance values of all elements of the main line provided between the adjacent outgoing lines become constant values (standard values), respectively. Therefore, charge and discharge times and power consumption of a part to be controlled can be advantageously and accurately estimated before cell arrangement is completed.

According to a preferred embodiment of the present invention, branching positions of the plural outgoing lines of the power supply path on the power supply side of the high potential correspond to branching positions of the plural outgoing lines of the power supply path on the power supply side of the low potential in the longitudinal direction of the power supply paths.

Thus, influences of the existence of the outgoing lines of the power supply path on the power supply side of the high potential, applied to the stray capacitance values of the elements in the main line and the outgoing lines of the power supply path on the power supply side of the low potential can be equalized. Furthermore, influences of the existence of the outgoing lines of the power supply path on the power side of the low potential, applied to the stray capacitance values of the elements in the main line and the outgoing lines of the power supply path on the power supply side of the high potential can be equalized. As a result, charge and discharge times and power consumption of a part to be controlled can be advantageously estimated before cell arrangement is completed.

According to still another embodiment of the present invention, lengths of the outgoing lines are set so as to be equal to each other in both the power supply paths on the power supply sides of the high potential and the low potential, respectively.

Thus, the resistance values and stray capacitance values of all outgoing lines can be equal to each other, respectively. As a result, charge and discharge times and power consumption of a part to be controlled can be advantageously estimated before cell arrangement is completed.

According to still another embodiment of the present invention, the lengths of the plural outgoing lines of the power supply path on the power supply side of the high potential are set so as to be longer than the lengths of the plural outgoing lines of the power supply path on the power supply side of the low potential.

Thus, a clear distinction can be made with respect to resistance values and stray capacitance values of the outgoing lines between the power supply path on the power supply side of the high potential and that on the power supply side of the low potential. As a result, charge and discharge times and power consumption of a part to be controlled can be advantageously estimated before cell arrangement is completed.

According to still another embodiment of the present invention, widths of the respective plural outgoing lines are equal to each other and set so as to be smaller than distances between the adjacent outgoing lines in both the power supply paths on the power supply sides of the high potential and the low potential, respectively.

Thus, resistance values and stray capacitance values of the outgoing lines are equalized. As a result, charge and discharge times and power consumption of a part to be controlled can be advantageously estimated before cell arrangement is completed.

It is noted that some or all of the foregoing embodiments can be combined into a single embodiment.

The foregoing and other aspects will become apparent from the following description of the invention when considered in conjunction with the accompanying drawing figures.

BRIEF DESCRIPTION OF THE DRAWING FIGURES

In all these figures, like components are indicated by the same numerals.

DETAILED DESCRIPTION

Hereinafter, preferred embodiments of the present invention are described with reference to the drawings.

(Auxiliary Explanation)

Figure 5:
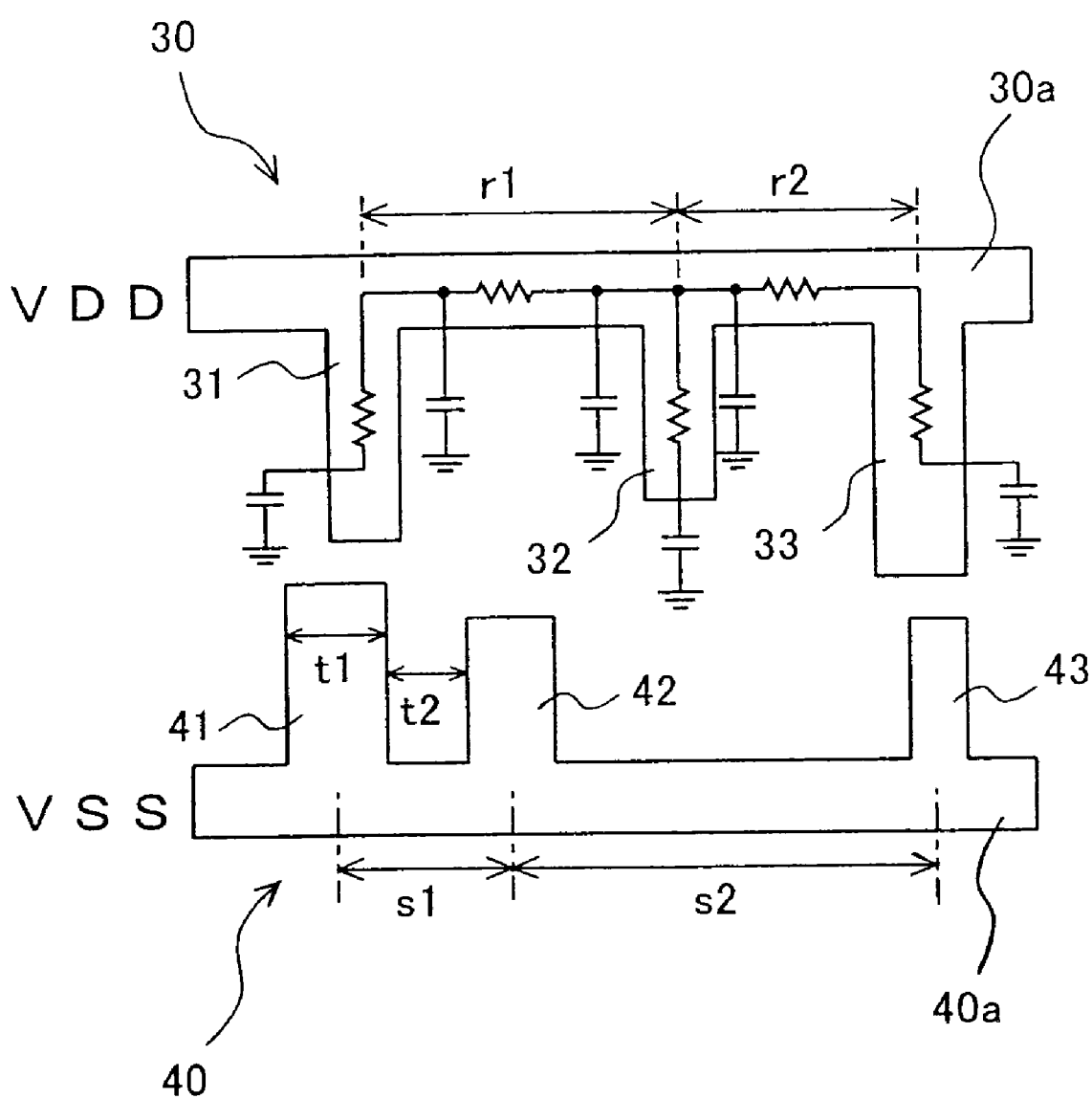
FIG. 5 is a plan view showing a structure of a power supply path for an auxiliary explanation.

Before a description is given of a structure of a power supply path utilized in the design of an integrated circuit according to the embodiments of the present invention, a description is given of a power supply path structure to be premised with reference to FIG. 5 in order to be easily understood.

FIG. 5 is a plan view showing a power supply path structure utilized in the design of an integrated circuit for an auxiliary explanation. This figure illustrates a part in which a power supply is controlled. Referring to FIG. 5, reference numeral 30 designates a power supply path on a power supply VDD side of a high potential, reference numeral 30a designates a main line and reference numerals 31, 32 and 33 designate outgoing lines branching off from the main line 30a, reference numeral 40 designates a power supply path on a power supply VSS side of a low potential, reference numeral 40a designates a main line, and reference numerals 41, 42 and 42 designate outgoing lines branching off from the main line 40a. In FIG. 5, resistance and capacitance as an equivalent circuit are illustrated in a superimposed manner.

Referring to the power supply path 30 on the VDD side, a pitch r1 between the adjacent outgoing lines 31 and 32 does not coincide with a pitch r2 between the adjacent outgoing lines 32 and 33 (r1≠r2). This is similar in the power supply path 40 on the VSS side (s1≠s2).

In addition, branching positions of the outgoing lines 31, 32 and 33 are shifted from the branching positions of the outgoing lines 41, 42 and 43 in the longitudinal direction of the power supply paths.

In addition, lengths of the outgoing lines 31, 32 and 33 are not equal and lengths of the outgoing lines 41, 42 and 42 are also not equal.

In addition, referring to the widths of the outgoing lines, a width of the outgoing line 33 is not equal to those of the outgoing lines 31 and 32. Furthermore, a width of the outgoing line 43 is not equal to those of the outgoing lines 41 and 42.

Furthermore, a distance t2 between the outgoing lines 41 and 42 is smaller than a width t1 of the outgoing line 41 (t1 >t2).

Thus, the configurations and dimensions of the outgoing lines of the power supply path in a part to be controlled are different from each other.

When a voltage at a part of an integrated circuit or the whole thereof is controlled, an estimate for charge and discharge times has been made after cell arrangement is completed and the power supply path is determined. In this estimate, a resistance value and a stray capacitance value of a main line, and a resistance value and a stray capacitance value of an outgoing line of the power supply path are comprehensively considered to calculate the charge and discharge times and power consumption. When this estimate is made after cell arrangement is completed and the power supply path is determined, it is all right if configurations and dimensions of the outgoing lines of the power supply path are different from each other. However, in recent years, a high-performance and sophisticated system has been increasingly developed and accordingly, it is very important to estimate the charge and discharge times and power consumption at an early stage of designing.

Hereinafter, a description is given of a structure of a power supply path utilized in the design of an integrated circuit according to preferred embodiments of the present invention with reference to the drawings.

(First Embodiment)

Figure 1:
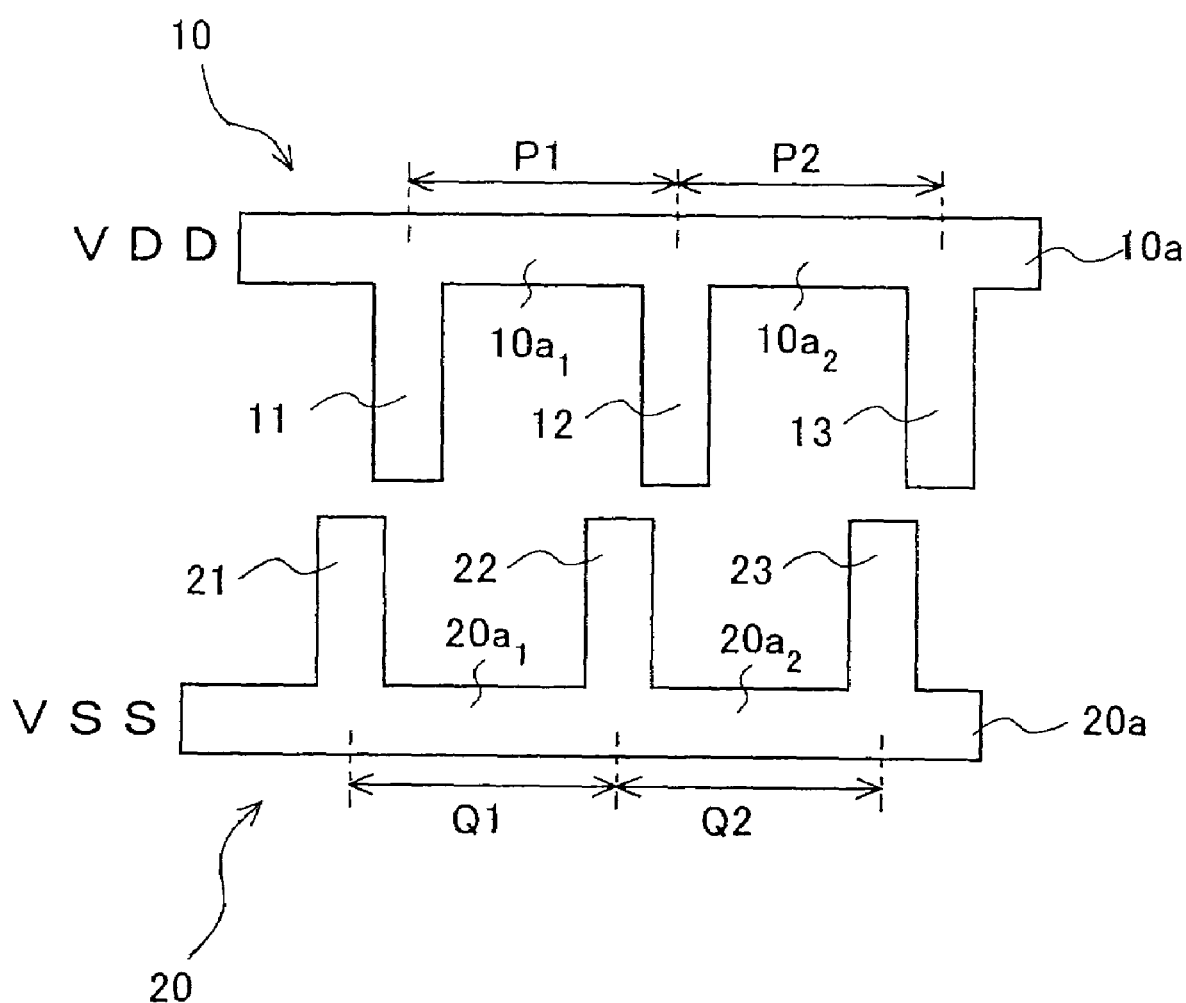
FIG. 1 is a plan view showing a structure of a power supply path utilized in the design of an integrated circuit according to a first embodiment of the present invention.

FIG. 1 is a plan view showing a structure of a power supply path utilized in the design of an integrated circuit according to a first embodiment of the present invention.

Referring to FIG. 1, reference numeral 10 designates a power supply path on the side of VDD, reference numeral 10a designates a main line, reference numerals 11, 12 and 13 designate outgoing lines branching off from the main line 10a, reference numeral 20 designates a power supply path on the side of VSS, reference numeral 20a designates a main line, and reference numerals 21, 22 and 23 designate outgoing lines branching off from the main line 20a.

Referring to the outgoing lines 11, 12 and 13 of the power supply path 10 on the side of VDD, pitches P1 and P2 between their branching positions are equal to each other (P1=P2). Similarly, referring to the outgoing lines 21, 22 and 23 of the power supply path 20 on the side of VSS, pitches Q1 and Q2 between their branching positions are equal to each other (Q1=Q2).

In other words, the pitches between the branching positions of the outgoing lines are constant on the sides of VDD and VSS, respectively. In addition, according to the illustrated example, it is satisfied that P1=P2=Q1=Q2.

Furthermore, in this embodiment of the present invention, a relation of lengths of the outgoing lines between the power supply path on the side of VDD and the power supply path on the side of VSS is not an issue, and neither is a relation of lengths of the plural outgoing lines on the same power supply path.

According to this embodiment, the outgoing lines on the power supply path are disposed at the same pitch and referring to elements $10a_1$ and $10a_2$ or $20a_1$ and $20a_2$ of the main line between the adjacent outgoing lines, since a resistance value and a stray capacitance value of the each element of the main line are constant values (standard values), respectively, charge and discharge times and power consumption of a part to be controlled can be advantageously and accurately estimated before the cell arrangement is completed.

(Second Embodiment)

Figure 2:
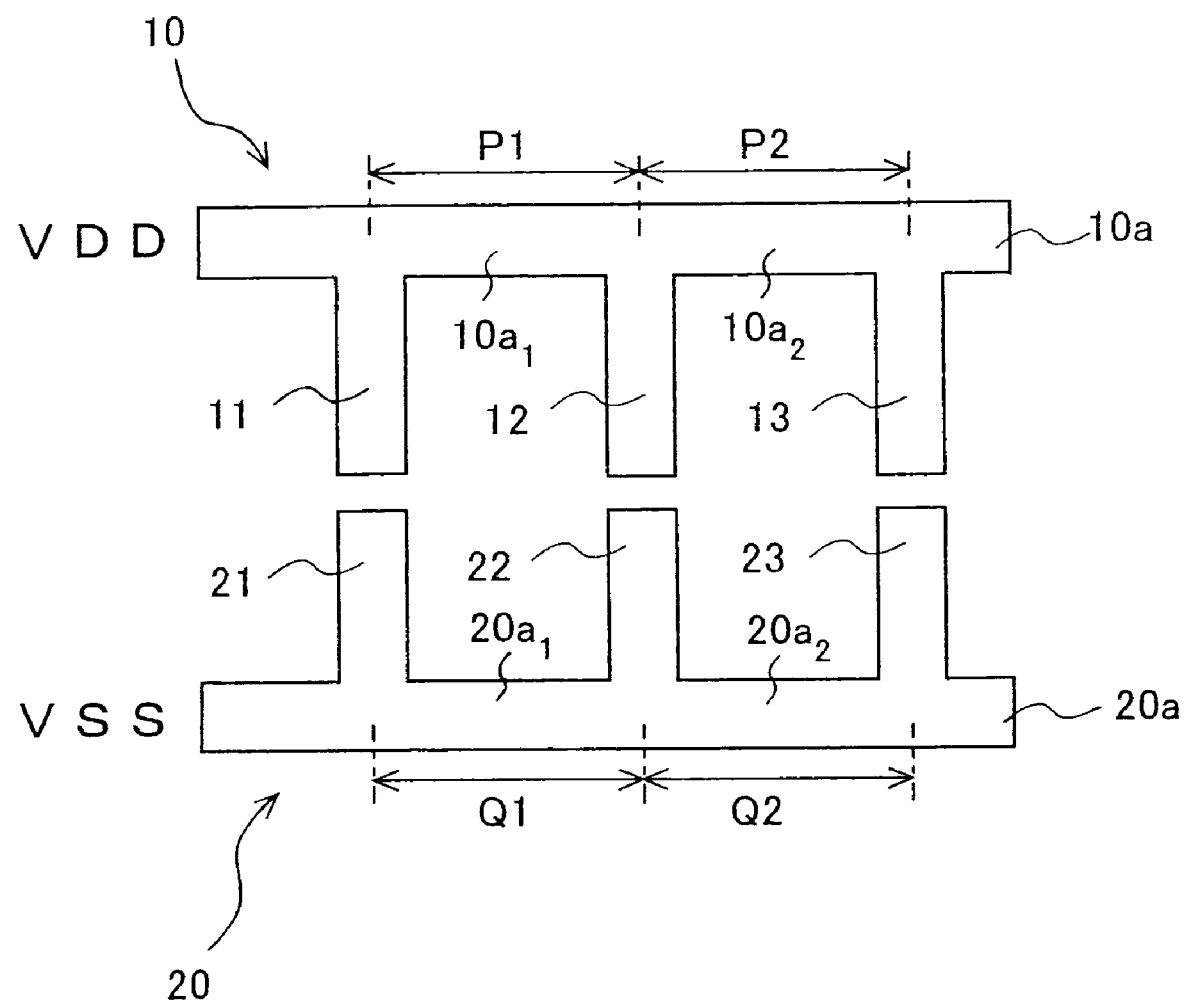
FIG. 2 is a plan view showing a structure of a power supply path utilized in the design of an integrated circuit according to a second embodiment of the present invention.

FIG. 2 is a plan view showing a structure of a power supply path utilized in the design of an integrated circuit according to a second embodiment of the present invention.

According to this embodiment, branching positions of outgoing lines 11, 12 and 13 in a power supply path 10 on the side of VDD correspond to branching positions of the outgoing lines 21, 22 and 23 in a power supply path 20 on the side of VSS in the longitudinal direction of the power supply paths. As is clear from FIGS. 1 and 2, the upper and lower power supply paths are shifted in the lateral direction in FIG. 1 while there is no such a shift in FIG. 2. Since the constitution is the same as the first embodiment shown in FIG. 1 except for this point, the same part is allotted to the same reference numeral or sign and its description is omitted.

In addition, a relation of lengths of the outgoing lines between the power supply path on the side of VDD and the power supply path on the side of VSS is not an issue in this embodiment.

According to this embodiment, influences of the existence of the outgoing lines 11, 12 and 13 of the power supply path 10 on the side of VDD, applied to the stray capacitance values of the elements $20a_1$ and $20a_2$ in the main line and the outgoing lines 21, 22 and 23 of the power supply path 20 on the side of VSS can be equalized. Furthermore, influences of the existence of the outgoing lines 21, 22 and 23 of the outgoing line 20 on the side of VSS, applied to the stray capacitance values of the elements $10a_1$ and $10a_2$ in the main line and the outgoing lines 11, 12 and 13 of the power supply path 10 on the side of VDD can be equalized. As a result, charge and discharge times and power consumption of a part to be controlled can be advantageously and accurately estimated before cell arrangement is completed.

(Third Embodiment)

Figure 3:
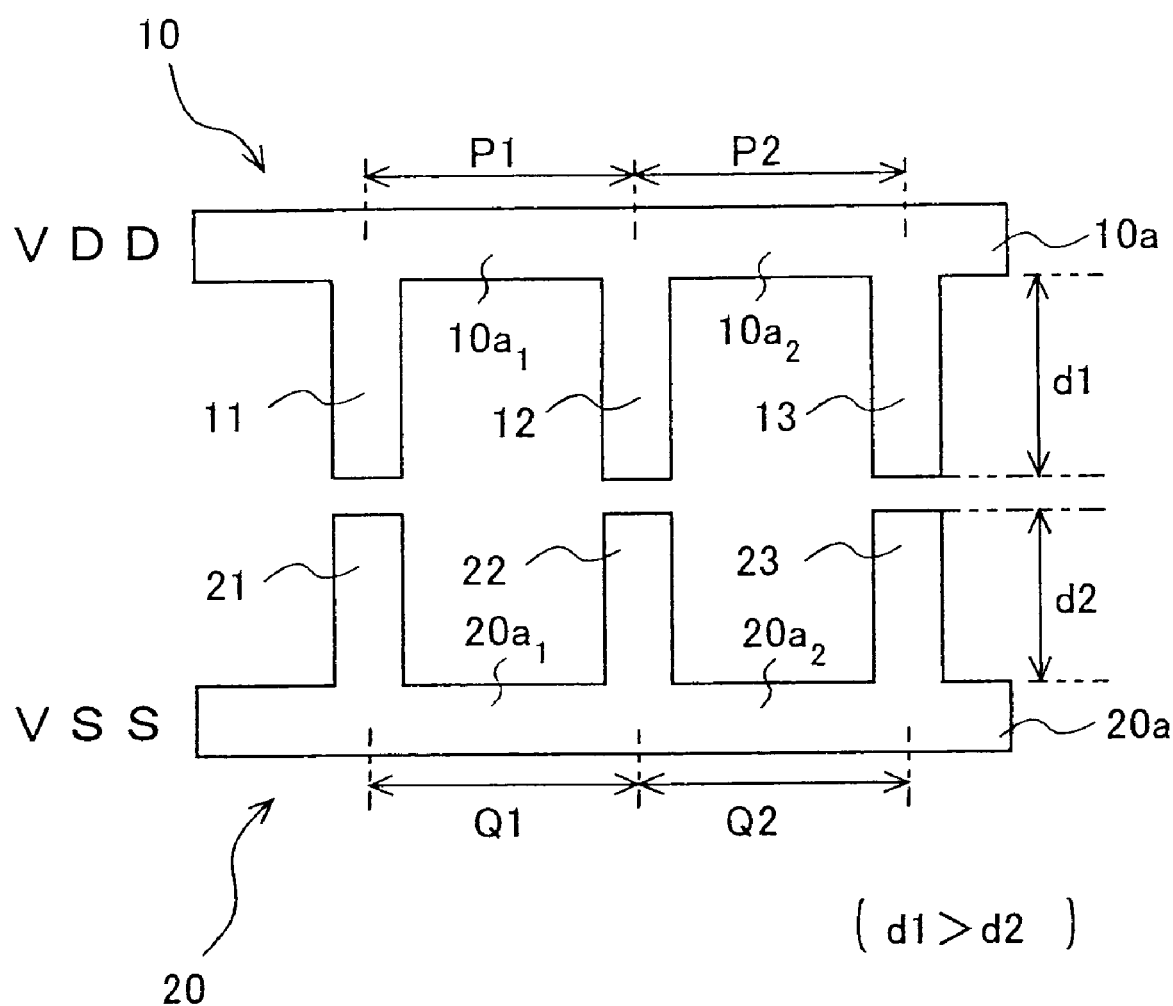
FIG. 3 is a plan view showing a structure of a power supply path utilized in the design of an integrated circuit according to a third embodiment of the present invention.

FIG. 3 is a plan view showing a structure of a power supply path utilized in the design of an integrated circuit according to a third embodiment of the present invention.

According to this embodiment, referring to a relation of lengths of outgoing lines, lengths of outgoing lines 11, 12 and 13 of a power supply path 10 on the side of VDD are each equal to d1 and also, lengths of outgoing lines 21, 22 and 23 of a power supply path 20 on the side of VSS are each equal to d2. Furthermore, the length d1 of each of the outgoing lines 11, 12 and 13 is set so as to be longer than the length d2 of each of the outgoing lines 21, 22 and 23 (d1>d2). Since the constitution is the same as that of the second embodiment shown in FIG. 2 except for this point, the same part is allotted to the same reference numeral or sign and its description is omitted.

According to this embodiment, since a clear distinction can be made between resistance values and stray capacitance values of the outgoing lines 11, 12 and 13 of the power supply path 10 on the side of VDD, and resistance values and stray capacitance values of the outgoing lines 21, 22 and 23 of the power supply path 20 on the side of VSS, charge and discharge times and power consumption of a part to be controlled can be advantageously and accurately estimated before cell arrangement is completed.

In addition, it is preferable that this embodiment comprise the structures of the first and second embodiments.

(Fourth Embodiment)

Figure 4:
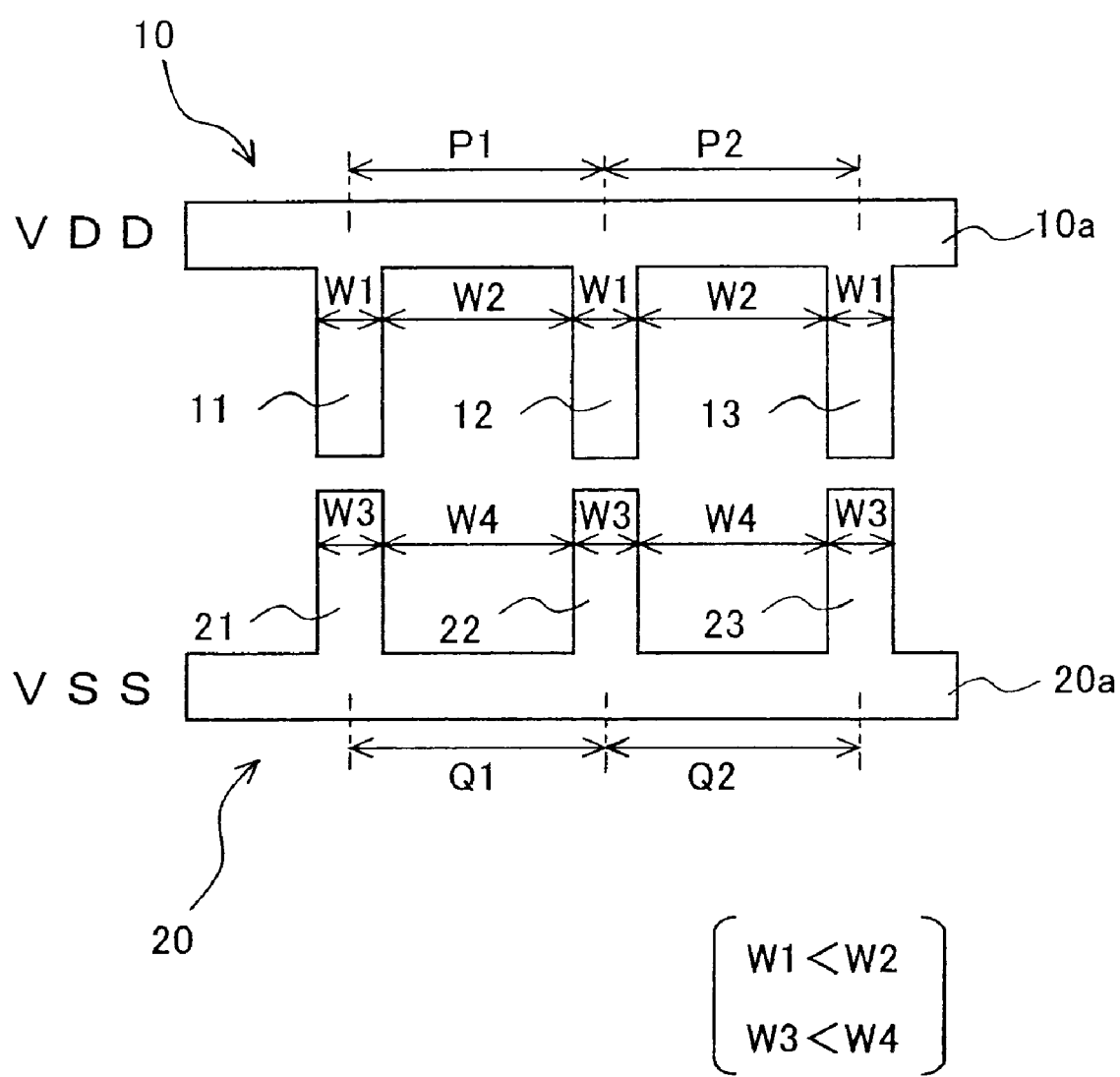
FIG. 4 is a plan view showing a structure of a power supply path utilized in the design of an integrated circuit according to a fourth embodiment of the present invention.

FIG. 4 is a plan view showing a structure of a power supply path utilized in the design of an integrated circuit according to a fourth embodiment of the present invention.

According to this embodiment, a width W1 of each outgoing lines 11, 12 and 13 is set so as to be shorter than a distance W2 between the outgoing lines in a power supply path 10 on the side of VDD (W1<W2). In addition, a width W3 of each of outgoing lines 21, 22 and 23 is set so as to be shorter than a distance W4 between the outgoing lines in a power supply path 20 on the side of VSS (W3<W4). Furthermore, it is preferable that W1 =W3 and W2=W4. Since the constitution is the same as that of the third embodiment shown in FIG. 3 except for this point, the same part is allotted to the same reference numeral or sign and its description is omitted.

According to this embodiment, since resistance values and stray capacitance values of the outgoing lines can be equalized, charge and discharge times and power consumption of a part to be controlled can be advantageously estimated before cell arrangement is completed.

Furthermore, it is preferable that this embodiment comprises the structures of the first and second embodiments, or the structures of the first and third embodiments.

According to the present invention as described above, referring to the plurality of outgoing lines of the power supply path on the power supply side of a high potential and the plurality of outgoing lines of the power supply path on the power supply side of a low potential, since their pitches, lengths and widths are equalized, the resistance values and the stray capacitance values of the elements of the main line and outgoing lines in each power supply path can be equalized. As a result, the charge and discharge times and power consumption of the parts to be controlled can be advantageously estimated before the cell arrangement is completed.

From the above description, it will be apparent what the present invention provides.

What is claimed is:

1. A structure of a power supply path utilized in the design of an integrated circuit, wherein in every cell in the integrated circuit, a power supply path on a power supply side of a high potential and a power supply path on a power supply side of a low potential are provided opposite each other, and wherein in every cell in the integrated circuit, the power supply path on the power supply side of the high potential and the power supply path on the power supply side of the low potential each comprise:

a main power line; and a plurality of outgoing power lines branching off from the main power line, wherein a plurality of pitches between adjacent outgoing power lines of the plurality of branched outgoing lines in the longitudinal direction of the main line are set so as to be equal to each other, and the pitch between the main power line of the power supply path on the power supply side of the high potential and the main power line of the power supply path on the power supply side of the low potential is set to be longer than the sum of the length of an outgoing line of the power supply side of the high potential and the length of an outgoing line of the power supply side of the low potential provided oppositely to said outgoing line of the power supply side of the high potential.

2. The structure of a power supply path utilized in the design of the integrated circuit according to claim 1, wherein branching positions of the plurality of outgoing power lines of the power supply path on the power supply side of the high potential correspond to branching positions of the plurality of outgoing power lines of the power supply path on the power supply side of the low potential in the longitudinal direction of the power supply paths.

3. The structure of a power supply path utilized in the design of the integrated circuit as in claim 2, wherein the lengths of the respective plurality of outgoing power line are set so as to be equal to each other in both the power supply paths on the supply side of the high potential and the low potential, respectively.

4. The structure of a power supply path utilized in the design of the integrated circuit as in claim 3, wherein the lengths of the plurality of outgoing power lines of the power supply path on the power supply side of the potential are set so as to be longer than the lengths of the plurality of out going power lines of the power supply path on the power supply side of the low potential.

5. The structure of a power supply path utilized in the design of the integrated circuit as in claim 4, wherein widths of the respective plurality of outgoing power lines are equal to each other and set so as to be smaller than distances between the adjacent outgoing power lines of both the power supply paths on the power supply sides of the high potential and the low potential, respectively.

6. The structure of a power supply path utilized in the design of the integrated circuit as in claim 2, wherein widths of the respective plurality of outgoing power lines are equal to each other and set so as to be smaller than distances between the adjacent outgoing power lines of both the power supply paths on the power supply sides of the high potential and the low potential, respectively.

7. The structure of a power supply path utilized in the design of the integrated circuit as in claim 3, wherein widths of the respective plurality of outgoing power lines are equal to each other and set so as to be smaller than distances between the adjacent outgoing power lines of both the power supply paths on the power supply sides of the high potential and the low potential, respectively.

8. The structure of a power supply path utilized in the design of the integrated circuit as in claim 1, wherein lengths of the respective plurality of outgoing power lines are set so as to be equal to each other in both the power supply paths on the power supply sides of the high potential and the low potential, respectively.

9. The structure of a power supply path utilized in the design of the integrated circuit as in claim 8, wherein lengths of the plurality of outgoing power lines of the power supply path on the power supply side of the high potential are set so as to be longer than the lengths of the plurality of outgoing power lines of the power supply path on the power supply side of the low potential.

10. The structure of a power supply path utilized in the design of the integrated circuit as in claim 9, wherein widths of the respective plurality of outgoing power lines are equal to each other and set so as to be smaller than distances between the adjacent outgoing power lines of both the power supply paths on the power supply sides of the high potential and the low potential, respectively.

11. The structure of a power supply path utilized in the design of the integrated circuit as in claim 8, wherein widths of the respective plurality of outgoing power lines are equal to each other and set so as to be smaller than distances between the adjacent outgoing power lines of both the power supply paths on the power supply sides of the high potential and the low potential, respectively.

12. The structure of a power supply path utilized in the design of the integrated circuit as in claim 1, wherein widths of the respective plurality of outgoing power lines are equal to each other and set so as to be smaller than distances between the adjacent outgoing power lines of both the power supply paths on the power supply sides of the high potential and the low potential, respectively.

13. The structure of a power supply path utilized in design of the integrated circuit as in claim 1, wherein the pitches between adjacent outgoing power lines of the power supply path on the power supply side of the high potential and the pitches between adjacent outgoing power lines of the power supply path on the power supply side of the low potential are set so as to be equal to each other.

* * * * *